(12) United States Patent
Khrushchev (10) Patent No.: US 10,101,010 B2
(45) Date of Patent: Oct. 16, 2018

(54) IRRADIATION DEVICE INCLUDING A PUMP RADIATION SOURCE

(71) Applicant: OSRAM GmbH, Munich (DE)

(72) Inventor: Sergey Khrushchev, Regensburg (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 15/328,505

(22) PCT Filed: Apr. 29, 2015

(86) PCT No.: PCT/EP2015/059412
§ 371 (c)(1),
(2) Date: Jan. 24, 2017

(87) PCT Pub. No.: WO2016/012111
PCT Pub. Date: Jan. 28, 2016

(65) Prior Publication Data
US 2017/0205049 A1   Jul. 20, 2017

(30) Foreign Application Priority Data

Jul. 24, 2014  (DE) .................... 10 2014 214 600

(51) Int. Cl.
*F21V 9/00*   (2018.01)
*F21V 13/14*  (2006.01)
(Continued)

(52) U.S. Cl.
CPC .............. *F21V 13/14* (2013.01); *F21V 5/04* (2013.01); *F21V 7/04* (2013.01); *F21V 7/22* (2013.01);
(Continued)

(58) Field of Classification Search
CPC ..... F21V 7/22; F21V 9/16; F21V 9/30; F21V 13/14
(Continued)

(56) References Cited

U.S. PATENT DOCUMENTS 9,075,293 B2 * 7/2015 Zhang .................. F21V 9/00
2012/0257386 A1  10/2012 Harbers et al.
(Continued)

FOREIGN PATENT DOCUMENTS

WO   2012091973 A1   7/2012

OTHER PUBLICATIONS

International Search Report based on application No. PCT/EP2015/059412 (9 pages) dated Aug. 5, 2015 and English Translation (2 pages) (Reference Purpose Only).

*Primary Examiner* — Evan Dzierzynski
*Assistant Examiner* — Keith Delahoussaye
(74) *Attorney, Agent, or Firm* — Viering, Jentschura & Partner MBB (57) ABSTRACT

Various embodiments relate to an irradiation device including a pump radiation source for emitting pump radiation, a conversion element for converting the pump radiation into conversion radiation of longer wavelength, and a reflection surface, which is reflective to the conversion radiation and on which backscattered conversion radiation emitted at a backscatter emission surface and thus counter to a useful direction is incident and is reflected therefrom back to the conversion element; said reflection surface is concavely curved relative to the conversion element in such a way that at least the backscattered conversion radiation emitted divergently from a surface centroid of the backscatter emission surface is incident on the reflection surface at an angle of incidence of at most 20° in terms of absolute value.

14 Claims, 7 Drawing Sheets

(51) Int. Cl.
*F21V 7/22* (2018.01)
*F21V 9/08* (2018.01)
*F21V 5/04* (2006.01)
*F21V 7/04* (2006.01)
*F21V 9/16* (2006.01)
*F21V 9/30* (2018.01)
*F21Y 115/10* (2016.01)

(52) U.S. Cl.
CPC .................. *F21V 9/08* (2013.01); *F21V 9/16* (2013.01); *F21V 9/30* (2018.02); *F21Y 2115/10* (2016.08)

(58) Field of Classification Search
USPC ......... 362/230, 231, 509, 510, 553, 554, 84; 353/20
See application file for complete search history.

(56) References Cited

U.S. PATENT DOCUMENTS

| | | |
|---|---|---|
| 2014/0016300 A1 | 1/2014 | Sato et al. |
| 2014/0177201 A1 | 6/2014 | Sheu |

\* cited by examiner

IRRADIATION DEVICE INCLUDING A PUMP RADIATION SOURCE

RELATED APPLICATIONS

The present application is a national stage entry according to 35 U.S.C. § 371 of PCT application No.: PCT/EP2015/059412 filed on Apr. 29, 2015, which claims priority from German application No.: 10 2014 214 600.3 filed on Jul. 24, 2014, and is incorporated herein by reference in its entirety.

TECHNICAL FIELD

Various embodiments relate to an irradiation device including a pump radiation source for emitting pump radiation and a conversion element for at least partially converting the pump radiation into longer-wave conversion radiation.

BACKGROUND

The conversion element can be used, for example, in conjunction with a laser as the pump radiation source and can convert its shortwave and therefore higher-energy pump radiation. The pump radiation can be, for example, UV radiation or blue light, the wavelength of the conversion radiation may be in the visible spectral range. A corresponding conversion element is also referred to as a phosphor element and can be arranged spaced apart from the pump radiation source in a so-called remote phosphor arrangement. If the conversion/phosphor element is then irradiated using pump radiation in operation, it emits conversion radiation, for example, visible conversion light, and can thus be used, for example, as a light source of higher light density.

The present disclosure is based on the technical problem of specifying an irradiation device, which is advantageous in relation to the prior art, including pump radiation source and conversion element.

SUMMARY

Various embodiments are achieved by an irradiation device including a pump radiation source for emitting pump radiation, a conversion element for at least partially converting the pump radiation into longer-wave conversion radiation, which conversion element has a conversion radiation emission surface, and a reflection surface, which is at least partially reflective for the conversion radiation and on which backscatter conversion radiation is incident, which the conversion element emits on a backscatter emission surface opposite to the conversion radiation emission surface, which reflection surface is concavely curved with respect to the conversion element such that at least all of the backscatter conversion radiation, which is divergently emitted in a surface focal point of the backscatter emission surface, is incident on the reflection surface at a respective angle of incidence of the absolute value of at most 20°.

Preferred embodiments are found in the description and the dependent claims, wherein the description does not always differentiate in detail between aspects of the device and method and/or use; in any case, the disclosure is to be read implicitly with respect to all claim categories.

Figure 1:
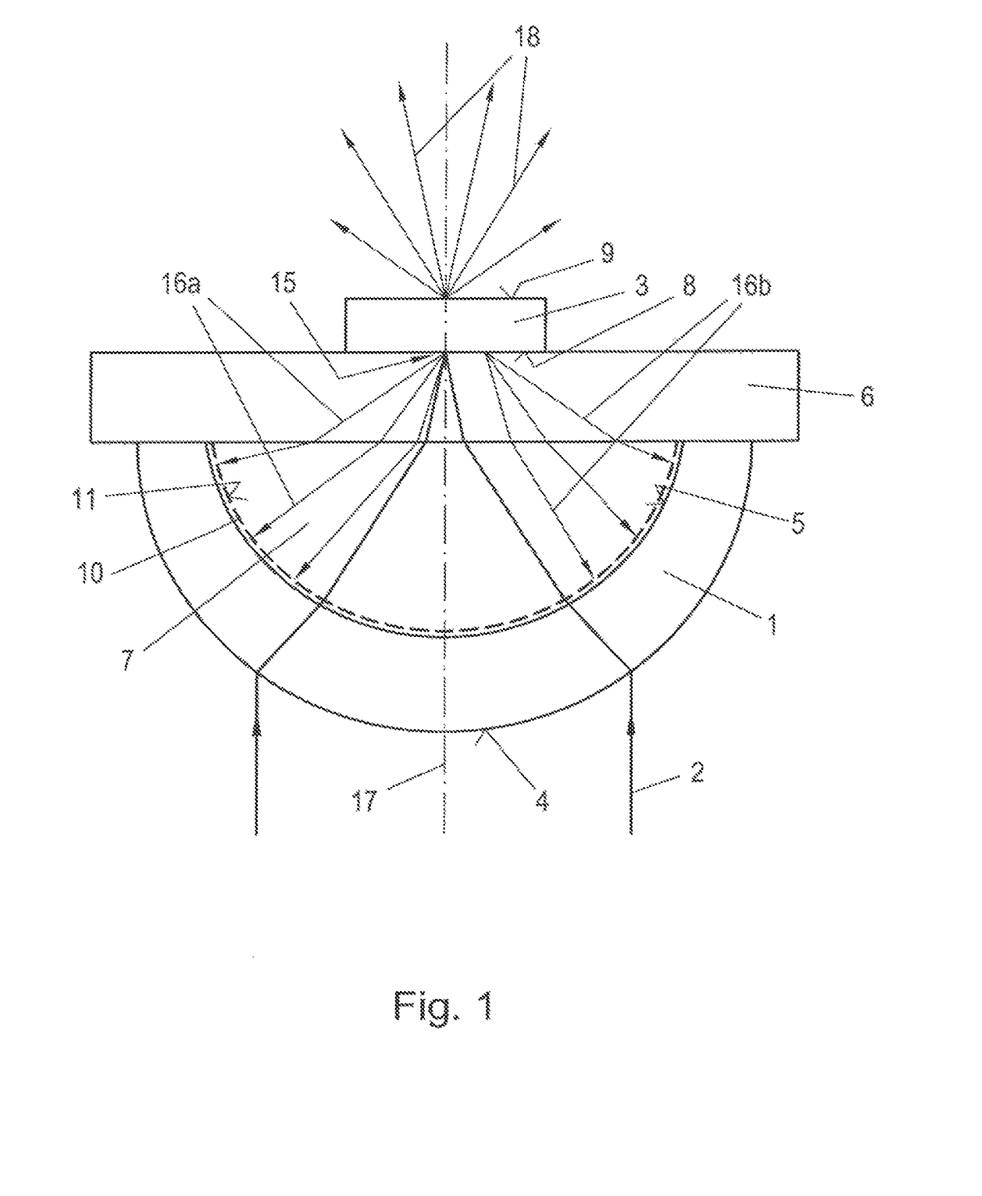
FIG. 1 shows a part of a first illumination device according to various embodiments having a dichroic reflection surface in a schematic section.

In one preferred embodiment, a pump radiation incidence surface of the conversion element and the conversion radiation emission surface are located on opposing sides of the conversion element, which is thus operated in transmission (cf. for example, FIG. 1). The pump radiation is incident in this case on the pump radiation incidence surface, and the conversion radiation emitted at the opposing conversion radiation emission surface is used, for example, as conversion light for illumination. The emission of the conversion radiation takes place omnidirectionally in principle, however (and therefore also "to the rear"). Light emitted "to the front" in relation to the conversion radiation emission surface can furthermore also be deflected "to the rear", for example, by scattering processes inside the conversion element.

As a result, during operation in transmission, conversion radiation is emitted in any case not only on the conversion radiation emission surface but rather also on the pump radiation incidence surface. On the other hand, the conversion element can also be operated in reflection, i.e., the pump radiation can be incident on a pump radiation incidence surface and the conversion radiation can be emitted from the same surface (used in the above-described meaning); the pump radiation incidence surface is then thus identical to the conversion radiation emission surface. Conversion radiation is also emitted on a surface opposite to the conversion radiation emission surface in this case for the mentioned reasons.

The surface of the conversion element opposite to the conversion radiation emission surface (from which the light is supplied to the illumination) is referred to as the "backscatter emission surface" independently of operation in transmission or reflection. In the case of operation in transmission, the backscatter emission surface is at the same time the pump radiation incidence surface, in the case of operation in reflection, it is opposite to the pump radiation incidence surface.

In any case, in simple terms, conversion radiation is emitted in the wrong direction on the backscatter emission surface. Therefore, the reflection surface is provided to increase the proportion of the conversion radiation emitted "to the front". In the present case, "backscatter conversion radiation" refers to the part of the conversion radiation emitted on the backscatter emission surface which is incident on the reflection surface.

As a result of a reflection back to the conversion element, the backscatter conversion radiation then has a directional component to the front, i.e., the proportion of the conversion radiation emitted to the front is increased. "To the front" means having a directional component along a normal on the conversion radiation emission surface, "to the rear" means having an opposing directional component (equivalent in the case of transmission and reflection). With regard to the most efficient possible usage of the generated conversion radiation, for example, at least 60%, advantageously at least 80%, more advantageously at least 90% of the conversion radiation emitted on the backscatter emission surface can be backscatter conversion radiation.

As explained in greater detail hereafter, the reflection layer for operation in transmission may be a dichroic layer, which is transmissive to the pump radiation but reflects the conversion radiation. This dichroic layer may be then provided on a lens which is upstream from the conversion element with respect to the pump radiation. Proceeding from the pump radiation source, the pump radiation then thus traverses the lens and the reflection layer and is incident on the pump radiation incidence surface. In contrast thereto, the backscatter conversion radiation emitted thereon is not transmitted on the reflection surface, but rather reflected, at least substantially.

In the irradiation device according to various embodiments, the reflection surface is now concavely curved such that at least the backscatter conversion radiation emitted divergently (i.e., at different spatial angles) in the middle of the pump radiation incidence surface is incident at angles of incidence on the reflection surface which are at most 20° in absolute value, in this sequence increasingly advantageously at most 15°, 10°, 5°, and 3°. The absolute value is considered in this case, i.e., an absolute value function of the angle of incidence (the absolute value).

The "angle of incidence" is taken as the smallest angle between the respective incident beam and a respective surface normal on the pump radiation incidence surface in the respective point of incidence; in other words, an essentially perpendicular incidence (parallel to the respective surface normal, angle of incidence of 0°) of the backscatter conversion radiation on the reflection surface is preferred (both in operation in transmission and also in reflection). The reflection surface is therefore concavely curved "with respect to" the conversion element, i.e., bulging away from the conversion element when viewed from the conversion element (going inward from the edge of the reflection surface).

With the curvature, not only does a mean value of the angles of incidence decrease, but also the variance thereof. In comparison thereto, for example, in case of a planar reflection surface, which is oriented in parallel to the backscatter emission surface, the backscatter conversion radiation will be incident on the reflection surface at all angles of incidence between 0° and, for example, 70° (or greater, depending on the arrangement and distance). The emission of the conversion radiation on the backscatter emission surface is typically Lambertian. In the comparison case, the conversion radiation would thus be incident at greatly varying angles of incidence. This can be disadvantageous, for example, insofar as the reflection properties of a dichroic reflection mirror can sometimes display strong dependence on the angle of incidence, cf. FIG. 4 for illustration.

Thus, a dichroic reflection layer, which is constructed, for example, as a dielectric multilayer system, can be optimized, for example, toward perpendicular radiation incidence (angle of incidence of 0°). If the reflection window shifts with increasing angle of incidence, conversion radiation can be transmitted unintentionally, for example, which worsens the efficiency. In that the variance of the angles of incidence is reduced according to various embodiments, more radiation can accordingly be incident at angles of incidence suitable for the respective reflection surface.

On the other hand, a corresponding concave curvature can also be advantageous in the case of a reflection surface which also reflects the pump radiation (also referred to as "full mirroring"), however. This is possible during operation (of the conversion element) in reflection, on the one hand. On the other hand, the reflection surface can have a small aperture in relation to its surface area for operation in transmission, for example, through which the pump radiation passes from the pump radiation source to the pump radiation incidence surface (alternatively, the pump radiation can also be guided past the reflection surface). In case of such full mirroring, the concave curvature can then also offer advantages with respect to a reflection of backscatter pump radiation, for example, i.e., pump radiation which is not converted and is re-emitted on the backscatter emission surface.

The backscatter pump radiation can be emitted divergently comparably to the backscatter conversion radiation on the backscatter emission surface, i.e., also in a Lambertian manner. The backscatter pump radiation is accordingly also incident approximately perpendicularly on a reflection surface curved according to various embodiments. Outward and return paths are therefore approximately identical, the backscatter pump radiation is thus guided back to the conversion element, which then increases the overall converted proportion and therefore can improve the efficiency.

Furthermore, the concave curvature can also offer an advantage in general, i.e., both in the case of a dichroic reflection layer and also in the case of full mirroring, also during the return of the backscatter conversion radiation. With the essentially perpendicular incidence of the backscatter conversion radiation, outward and return paths are nearly coincident, i.e., a good part of the reflected backscatter conversion radiation is incident on the backscatter emission surface. If this backscatter conversion radiation then traverses the conversion element, it can be used downstream jointly with the original conversion radiation emitted on the conversion radiation emission surface. An optical unit mounted downstream from the conversion element thus does not have to take into consideration, for example, backscatter conversion radiation guided separately past "adjacent" to the conversion element.

In general, the conversion radiation emission surface can be associated with an optical unit for "collecting" the conversion radiation emitted there, for example, an imaging optical unit, such as a lens or a reflector, or a non-imaging optical unit, for example, a compound parabolic concentrator (CPC). In the case of the operation (of the conversion element) in reflection, this optical unit or a part thereof can also guide the pump radiation to the conversion element.

Back to the reflection surface: the angle of incidence condition relates to the surface focal point, i.e., backscatter conversion radiation emitted spaced apart from the surface focal point can also be incident, for example, with a (somewhat) more strongly varying angle of incidence on the reflection surface. In relation to the comparison case of a planar reflection surface, by way of optimization with respect to the surface focal point, however, the angle of incidence variance for backscatter conversion radiation emitted spaced apart from the surface focal point is also reduced.

The "surface focal point" can, for example, in the preferred case of a rectangular backscatter emission surface, correspond to the intersection point of the diagonals or, in the case of a circular backscatter emission surface, the circle center point. An optical axis of the lens may penetrate the surface focal point. A surface normal on the backscatter emission surface in the surface focal point can generally, for example, also be tilted in relation to an optical axis of the lens; this surface normal and the optical axis of the lens may be parallel to one another, however.

In one preferred embodiment, the reflection surface is concavely curved such that at least 80%, advantageously at least 90%, particularly advantageously at least 95% of the total backscatter conversion radiation is incident at an angle of incidence on the reflection surface which is not greater than 20° in absolute value (reference is made to the above disclosure with respect to further preferred maximum angles of incidence). In that the curvature is accordingly optimized toward the overall backscatter emission surface, the variance of the angles of incidence is reduced as a whole, i.e., also for the backscatter conversion radiation emitted spaced apart from the surface focal point.

As already mentioned, in one preferred embodiment, the conversion element is operated in transmission, i.e., the backscatter emission surface is thus equivalent to the pump radiation incidence surface (the useful conversion radiation is emitted on the opposite side). In the present disclosure, "backscatter emission surface" is thus also to be read as the pump radiation incidence surface. Insofar as reference is made in general to operation in transmission/reflection, this relates in the entire disclosure to the conversion element, i.e., to which side thereof the useful conversion radiation is emitted on.

In the case of operation in transmission, a lens may be arranged between the pump radiation source and the conversion element, which lens has the reflection surface; a dichroic coating can thus be provided, for example, on the entry or exit surface of the lens.

The lens having the reflection surface is arranged "between" the pump radiation source and the conversion element, which relates to the path of the pump radiation. If the pump radiation path is deflected via a mirror, for example, the lens arranged between pump radiation source and conversion element can thus also be located outside a (geometrical) connecting straight line from pump radiation source to conversion element. The "lens" is a body which is transmissive in its volume, optionally omitting the reflection surface, for pump and conversion radiation, wherein at least the pump radiation entry surface or the exit surface may be curved, and both may be curved (cf. following description in detail).

In one preferred embodiment, the lens is provided and arranged so that it focuses the pump radiation on the conversion element, advantageously on its pump radiation incidence surface. In other words, the lens has a positive focal length and the pump radiation incidence surface of the conversion element is then arranged in the focal point. In general, the pump radiation can also be incident in non-collimated form on the lens, for example, such as in the case of a planar convex lens, on which the focused pump radiation is incident (see below). "Pump radiation incidence surface" refers in the scope of this disclosure to the entire lateral surface of the conversion element through which the pump radiation enters, i.e., not only the region thereof which the pump radiation illuminates. In the case of a cuboid conversion element, the pump radiation incidence surface can thus be, for example, a rectangular lateral surface of the cuboid and in the case of a cylindrical conversion element, it can be the circular footprint of the cylinder.

In one preferred embodiment, an optically active gas volume is arranged between the reflection surface and the conversion element, such as an inert gas volume or an air chamber. This applies in particular in case of a conversion element operated in transmission. In this case, "between" refers to the path of the backscatter conversion radiation. This gas volume does not have to fill up the entire region between reflection surface and conversion element, but rather, for example, a carrier plate, which is explained hereafter in greater detail, can additionally be provided between reflection surface and conversion element. "Optically active" means that the gas volume changes the beam path as a whole, i.e., it does not merely relate to microscopic air inclusions in an adhesive layer, for example.

The gas volume may adjoin the reflection surface (which is provided in this case for operation in transmission on a pump radiation exit surface of the lens). The gas volume can offer advantages relating to the adjustability of the curvature, for example, i.e., with respect to the design possibilities.

In general, in the case of operation in transmission, the lens could also be provided as a planar convex lens, for example, on the convex side of which the reflection surface would be arranged (if the convex side then faces away from the conversion element, the reflection surface is similarly concave in relation thereto); the conversion element could then also be provided in direct optical contact with the planar side, for example, i.e., adhesively bonded. Then, for example, pump radiation could be incident on the convex pump radiation entry surface having the reflection layer, which radiation is focused such that it penetrates the (convex) pump radiation entry surface perpendicularly.

In the case of a conversion element operated in reflection, in a preferred embodiment, a planar convex lens can also have the reflection surface; then, for example, the convex side of this planar convex lens is thus provided with a reflection layer forming the reflection surface, for example, a metal film. This planar convex lens and the conversion element are then arranged, for example, so that the backscatter emission surface of the conversion element faces toward the planar side of the planar convex lens, the conversion element may be fastened on the planar side, for example, via an adhesive layer.

The planar convex lens can then thus represent a carrier for the conversion element and can also cool it to a certain extent. The backscatter conversion radiation emitted on the backscatter emission surface then traverses the planar convex lens in any case and is reflected back, at least partially, to the conversion element on the convex reflection surface. This also applies to non-converted pump radiation.

In one preferred embodiment, the reflection surface is provided so that it at least regionally has the shape of a spherical surface. "At least regionally" means, for example, that at least 70%, advantageously at least 80%, more advantageously at least 90% of the region of the reflection surface on which backscatter conversion radiation is incident has the shape of a spherical surface. Backscatter conversion radiation may be incident on the entire reflection surface, the percentage specifications are thus to be read for the reflection surface as a whole.

The "spherical surface" may be based on a single sphere which has a radius R. The reflection surface may be the surface of a spherical segment, i.e., a spherical cap. With respect to a surface area, it can be preferable for the spherical reflection surface to have a surface area which, increasingly advantageously in this sequence, makes up at least 20%, 30%, 40%, or 45% of the surface area of the complete spherical surface (theoretically based on a complete sphere). Possible upper limits can be, for example, at most 70%, 60%, or 55%.

The backscatter emission surface has a mean extension x, which results by definition as the mean value of its smallest and largest extensions; in the preferred case of a planar backscatter emission surface, a respective (smallest and greatest) extension is taken along a respective straight line located in the plane of the backscatter emission surface. In the case of a circular backscatter emission surface, the mean extension results as the corresponding circle diameter (in the case of a rectangle as the mean value of the smallest edge length and a diagonal).

In one preferred embodiment, in the case of a reflection surface having the shape of a spherical surface, the radius R of the sphere on which it is based is selected so that it is greater than or equal to half of the mean extension x ($R \geq x/2$). Further advantageous lower limits for R can be, increasingly advantageously in this sequence, for example, at least $3x/4$, $x$, $5x/4$, $3x/2$, $7x/4$, or $2x$; independently thereof, possible upper limits can be, for example, at most $10x$, $8x$, $6x$, $4x$, or $3x$. The provision of a lower limit can be advantageous because the backscatter emission surface can appear increasingly "punctiform" i.e., small in relation with increasing radius R, whereby the angle of incidence condition may be achieved well. On the other hand, an upper limit can be of interest, for example, with respect to a compact construction and/or also relating to the material requirement.

The surface focal point of the backscatter emission surface has a distance d to the reflection surface, which is taken along a surface normal (in the surface focal point). In one preferred embodiment, this distance d is selected to be greater than or equal to the radius R of the sphere on which the spherical reflection surface is based. Possible upper limits can be, for example, d≤3R or d≤2R. If the backscatter conversion radiation propagates without refraction between backscatter emission surface and reflection surface, thus, for example, if a carrier plate, which is described in greater detail hereafter, is not provided, d=R may apply. In other words, the sphere center point is thus located on the backscatter emission surface.

Independently of the distance d, which is selected in particular, a spherical reflection surface may also be arranged such that the center point of the sphere on which it is based is located on a straight line which extends perpendicularly in relation to the backscatter emission surface through the surface focal point thereof.

In one preferred embodiment, a transmissive carrier, which may be a plane-parallel plate, is provided between conversion element and lens. At least the conversion element is fastened on the carrier, for operation in transmission, advantageously also the lens. In this case (operation in transmission), the conversion element is connected to the carrier having its pump radiation incident surface facing toward the carrier, advantageously via a joining connecting layer, particularly advantageously via an adhesive layer. In this regard, one advantage of the structure according to various embodiments can also be, for example, that the conversion element is not adhesively bonded directly on the reflection surface. This is because it could result in adhesion problems, for example, in the case of a dichroic reflection layer (or in general in the case of a very glossy reflection surface).

The "conversion element" is in general a body having a conversion material which converts the pump radiation, using a phosphor which converts the pump radiation into visible light.

The conversion element can be provided, for example, as a phosphor single crystal, which can be preferable, for example, in the case of a YAG or LuYAG phosphor (which is drawn using a seed crystal from the melt, for example).

Alternatively to the phosphor single crystal, for example, a phosphor ceramic can also be provided as the conversion element, the conversion element can thus be produced by sintering, for example. A further conversion element, which is also suitable for high-temperature applications, can be provided, for example, from a matrix material having elevated thermal conductivity, having a conversion material embedded therein; "elevated thermal conductivity" can mean, for example, a thermal conductivity of at least 0.5 W/mK, advantageously at least 1 W/mK, more advantageously at least 1.5 W/mK (one possible matrix material is glass, for example).

Now back to the carrier having the conversion element fastened thereon (operated in transmission). The lens may also be fastened on the carrier, specifically on the side thereof opposite to the conversion element. A gas volume may then be similarly provided between lens and carrier (with respect to the path of the backscatter conversion radiation). The reflection surface can thus be provided, for example, on a pump radiation exit surface of the lens, which protrudes like a dome away from the carrier (the fastening between lens and carrier can extend circumferentially around this dome).

In one preferred embodiment, the carrier is provided from sapphire, which can be preferable with respect to the heat dissipation from the conversion element fastened thereon, for example.

As already noted, the carrier may be a plane-parallel plate. It has a thickness t taken perpendicularly in relation to the plate directions, i.e., the directions of the planar extension.

Together with its index of refraction n (taken at the dominant wavelength of the conversion radiation), the following equations then result in one preferred embodiment for the distance d between surface focal point of the backscatter emission surface (=pump radiation incident surface) and reflection surface:

$$d \geq 0.7 \cdot (R + t \cdot (1 - 1/n)) \quad \text{(equation 1)}$$

and $$d \geq 1.3 \cdot (R + t \cdot (1 - 1/n)) \quad \text{(equation 2)}.$$

Further preferred lower limits for d can be 0.8 or 0.9 times $(R+t\cdot(1-1/n))$ and further preferred upper limits can be 1.2 or 1.1 times $(R+t\cdot(1-1/n))$. The provision of a lower limit (equation 1) is expressly also to be disclosed independently of the provision of an upper limit (equation 2).

The distance d is thus adapted to the plane-parallel plate (thickness t and index of refraction n) such that in spite of the offset, i.e., in spite of the refraction on the plane-parallel plate, the backscatter conversion radiation is incident substantially perpendicularly on the reflection surface.

In one preferred embodiment, the reflection surface is provided either on the pump radiation entry surface or the pump radiation exit surface of the lens, wherein the latter is preferred. The corresponding pump radiation passage surface is then concavely curved in relation to the conversion element—the pump radiation exit surface facing toward the conversion element is then thus also concave upon observation of the lens alone, while in contrast the opposing pump radiation entry surface, which therefore faces away from the conversion element, is convex upon observation of the lens alone (and therefore concave in relation to the conversion element).

In general, the "lens" (operation in transmission) could also be, for example, a lens system made of multiple single lenses connected to one another via adhesive, for example (cemented group). The reflection surface could then also be provided on the passage surface of one of the single lenses, which is located inside the lens system after the assembly. However, "lens" means a single lens and the reflection surface is provided on the pump radiation entry surface or also the exit surface.

The pump radiation entry surface faces toward the pump radiation source with respect to the pump radiation path, and the opposing pump radiation exit surface faces toward the conversion element, also with respect to the pump radiation path.

If the reflection surface is provided, in one preferred embodiment, on the pump radiation exit surface, the pump radiation entry surface may be furthermore also concavely curved with respect to the conversion element, i.e., it is convex upon observation of the lens itself. In other words, the lens may have the shape of a meniscus, typically a positive meniscus which focuses the pump radiation.

The pump radiation exit surface (having the reflection surface) may thus have a greater radius of curvature R than the pump radiation entry surface. One advantage of a lens, in which both pump radiation entry surface and also exit surface are curved, can result, for example, in the case of an optimization. Stated simply, this is because the curvature of the reflection surface can then be optimized independently of the pump radiation focusing and only the offset on the pump radiation exit surface is then to be considered in the optimization of the pump radiation entry surface, which focuses the pump radiation.

The positive meniscus and the conversion element may then arranged in relation to one another such that the optical axis of the positive meniscus penetrates the surface focal point of the pump radiation incident surface; a plane-parallel carrier plate may also particularly be provided in between, to which the optical axis is then perpendicular.

As already mentioned at the outset, the reflection layer, during operation in transmission, is in one preferred embodiment a dichroic reflection layer, which is transmissive to the pump radiation, i.e., transmits at least 70%, advantageously at least 80%, more advantageously at least 90% of the pump radiation. The transmissivity results here as the mean value over the spectral range of the pump radiation with respect to the specific irradiation situation (with regard to the passage angle) in the irradiation device. The reflection surface which is curved in relation to the conversion element can also offer advantages in this aspect, namely, for example, it can reduce the variance of the passage angle.

A corresponding dichroic reflection layer may be applied as a multilayer system, which is constructed from at least two respective layer materials; the layer materials differ in this case in the indices of refraction thereof. A first layer material can be, for example, silicon dioxide and a second layer material can be, for example, titanium dioxide. For the multilayer system, a plurality of layers are then formed from each layer material and arranged so that the various layer materials follow one another in sequence.

Independently of the structure in detail, a dichroic reflection layer also does not necessarily in this case (technically related) have to reflect all of the conversion radiation. The reflectivity averaged over the spectral range of the conversion radiation can thus be, for example, increasingly advantageously in this sequence, at least 30%, 40%, 50%, 60%, 70%, or 80%, again with respect to the specific situation in the irradiation device (relating to the angles of incidence).

In the case of a dichroic reflection surface, it is furthermore preferable that it then covers the entire pump radiation entry surface or exit surface, more advantageously the latter. In the present case, the "pump radiation entry surface" or "exit surface" refers to the corresponding lateral surface of the lens traversed by the pump radiation; a lateral surface of the lens can thus be a respective part of the outer surface, for example, which has a constant radius of curvature R (or is planar).

As also already mentioned at the outset, for operation in transmission, full mirroring can also be provided alternatively to the dichroic reflection surface. The pump radiation can then, for example, be guided through a hole in the reflection surface or advantageously past the reflection surface; the pump radiation can thus then traverse the lens in particular offset in relation to its optical axis (off axis configuration).

As already mentioned at the outset, the pump radiation source may be a laser (light amplification by stimulated emission of radiation), for example, a laser diode. In this case, "laser" can also be read as a plurality of laser sources in particular, for example, to an array of laser diodes.

The present disclosure also relates to the use of an irradiation device disclosed in the present case as a light source for illumination. Although the conversion radiation in general could be infrared radiation, for example, it may be visible light in this case. The conversion light emitted on the conversion radiation emission surface is then used for the illumination, for example, for projection purposes (as a light source of a projection device) or for external illumination of a motor vehicle. One preferred application can be, for example, as a light source of an automobile front headlight. In general, all of the pump radiation does not necessarily have to be converted (full conversion), but rather only a part can also be converted and then, for example, a mixture of pump radiation (pump light) and conversion light can also be used (partial conversion); full conversion is preferred.

BRIEF DESCRIPTION OF THE DRAWINGS

Various embodiments will be explained in greater detail hereafter on the basis of exemplary embodiments, wherein the individual features in the scope of the concurrent claims can also be essential to various embodiments in other combinations and furthermore differentiation is not always made in detail between the different claim categories.

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

FIG. 1 shows a part of an illumination device according to various embodiments, namely a lens 1, which focuses pump radiation 2 on a conversion element 3. The pump radiation 2 is incident in collimated form in this case on a pump radiation entry surface 4 of the lens 1, to then exit in a focused manner on a pump radiation exit surface 5.

The lens 1 is fastened, specifically adhesively bonded, on a plane-parallel carrier plate 6. Between the pump radiation exit surface 5 and the carrier plate 6, the pump radiation 2 traverses a gas volume, specifically in this case an air chamber 7, to then be incident through the carrier plate 6 on a pump radiation incidence surface 8 of the conversion element 3.

The conversion element 3 is a phosphor element, specifically a phosphor ceramic, which converts the pump radiation 2 (blue pump light in the present case) into conversion radiation of longer wavelength, which is in the visible spectral range in the present case and is referred to hereafter as conversion light. The phosphor can be a YAG:Ce phosphor, for example, which emits yellow conversion light. The conversion light emitted on a conversion radiation emission surface 9, which is opposite to the pump radiation incidence surface 8, is then used.

The emission of the conversion light takes place omnidirectionally in principle, however, conversion light is thus not only emitted on the conversion radiation emission surface 9, but rather also on the pump radiation incidence surface 8 (this is also the backscatter emission surface, but is still referred to as the pump radiation incidence surface hereafter).

To increase the efficiency, to thus also be able to use the conversion light emitted on the pump radiation incidence surface 8 at least partially for the illumination, a reflection layer 10 is provided on the pump radiation exit surface 5 of the lens 1. On the associated reflection surface 11, a majority of the conversion light emitted on the pump radiation incidence surface 8 is reflected back to the conversion element 3. The usage of this backscatter conversion light increases the efficiency.

In order that the pump radiation 2 can pass the reflection layer 10, the latter is provided as dichroic. The reflection layer 10 is thus transmissive for the pump radiation 2, but the backscatter conversion radiation is reflected thereon. To achieve this wavelength-dependent transmission/reflection, the reflection layer 10 is constructed as a multilayer system made of successive silicon dioxide/titanium dioxide layers.

Figure 3:
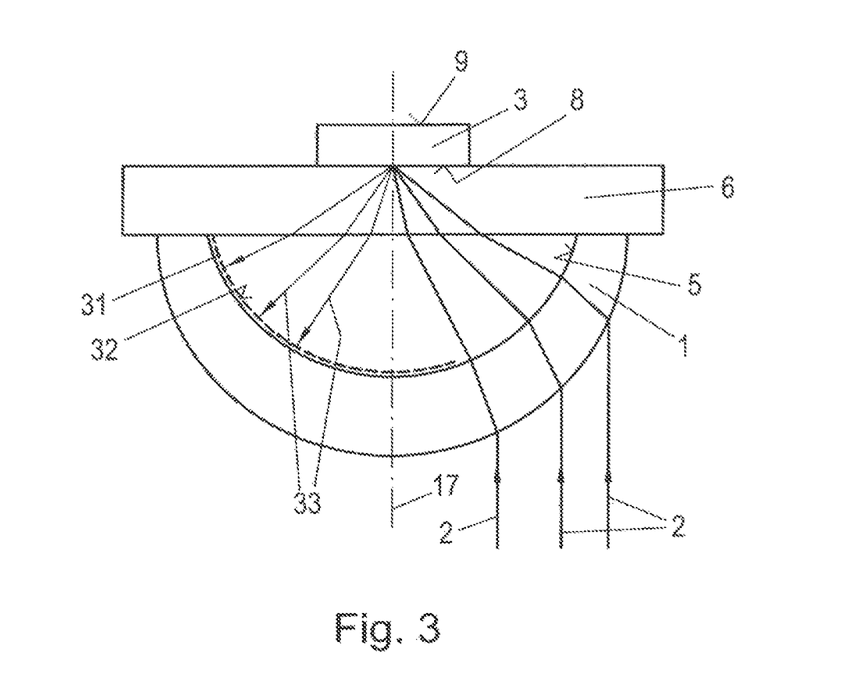
FIG. 3 shows a part of a second illumination device according to various embodiments having a reflection surface, which is reflective for the pump radiation, in a schematic section.
Figure 4:
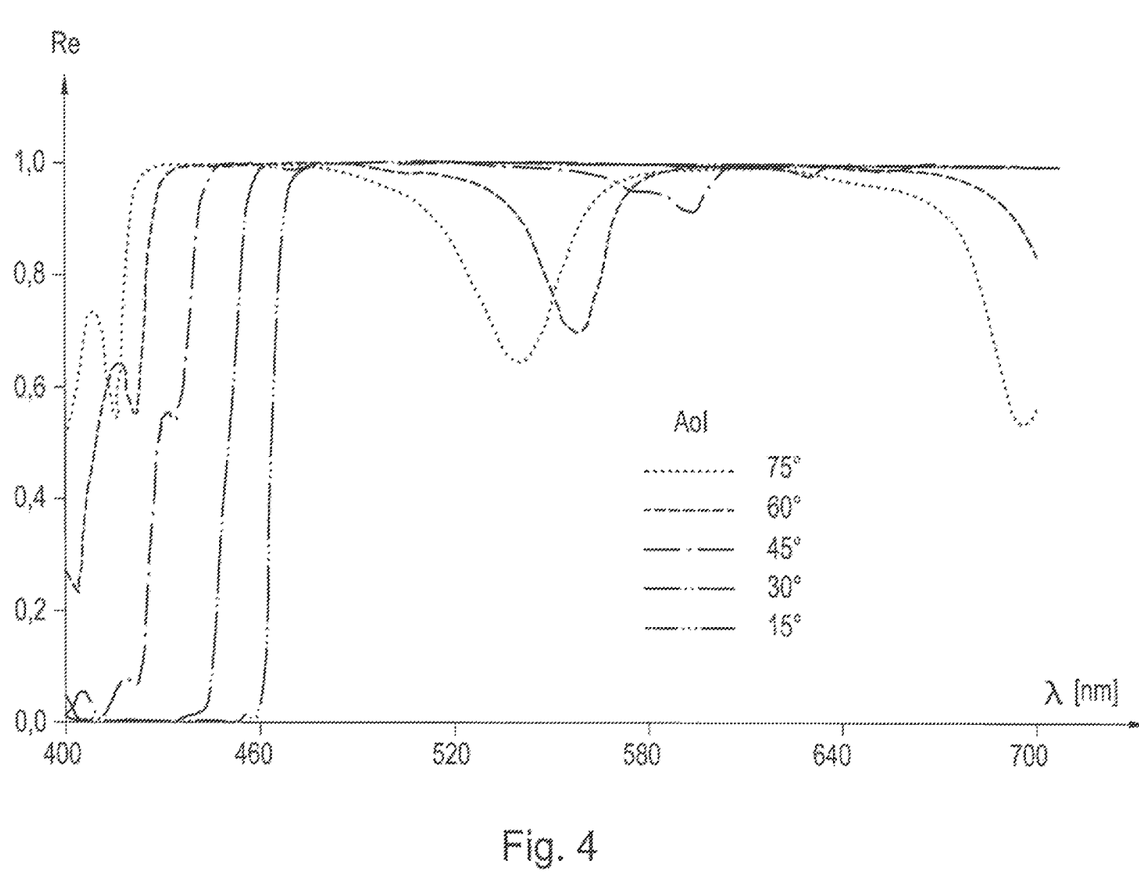
FIG. 4 shows the dependence of the reflectivity of a dichroic reflection layer on the angle of incidence.

FIG. 3 illustrates the wavelength-dependent reflectivity of such a layer system, it is thus reflective for the yellow conversion light, but can transmit the blue pump radiation. In FIG. 4, the reflectivity (y axis) is plotted over the wavelength (x axis), for five different angles of incidence (AoI) in relation to the surface normal. With increasing angle of incidence, the limiting wavelength, below which the multilayer system becomes transmissive, is shifted increasingly to the left, i.e., toward short wavelengths. Furthermore, a change in the reflection window can also be seen, specifically, for large angles of incidence, a collapse of the reflectivity occurs between approximately 520 and 580 nm.

As is apparent from FIG. 1, the pump radiation exit surface 5 of the lens 1 and therefore the reflection layer 10 having the reflection surface 11 is concavely curved such that at least the backscatter conversion light 16a, which is emitted in a surface focal point 15 of the pump radiation incidence surface 8, is incident substantially perpendicularly on the reflection surface. A respective angle of incidence, i.e., the angle between a respective surface normal and the respective incident beam, is 0° in the scope of routine technical accuracy.

However, backscatter conversion light 16 is emitted on the entire pump radiation incidence surface 8, not only in the surface focal point 15. The backscatter conversion light 16b which is emitted spaced apart from the surface focal point 15 is also incident nearly perpendicularly on the reflection surface 11, however, even for backscatter conversion light emitted at the edge of the pump radiation incidence surface 8, the angle of incidence is at most a few degrees (less than 3°).

In comparison to a reference case having a planar reflection surface 11, which is oriented perpendicularly in relation to the optical axis 17, the angles of incidence vary significantly less, on the one hand, and a mean angle of incidence is also significantly smaller. The reflectivity of the reflection layer 10 is therefore essentially equal for all of the backscatter conversion light 16, and the multilayer system can thus be correspondingly optimized and the backscatter conversion light 16 can therefore be efficiently used. As a result, more conversion light 18 is emitted on the conversion radiation emission surface 9 (for the sake of comprehensibility, only the conversion light 18 emitted in the surface focal point thereof is shown, the emission takes place in a Lambertian manner accordingly over the entire emission surface 9).

Figure 2:
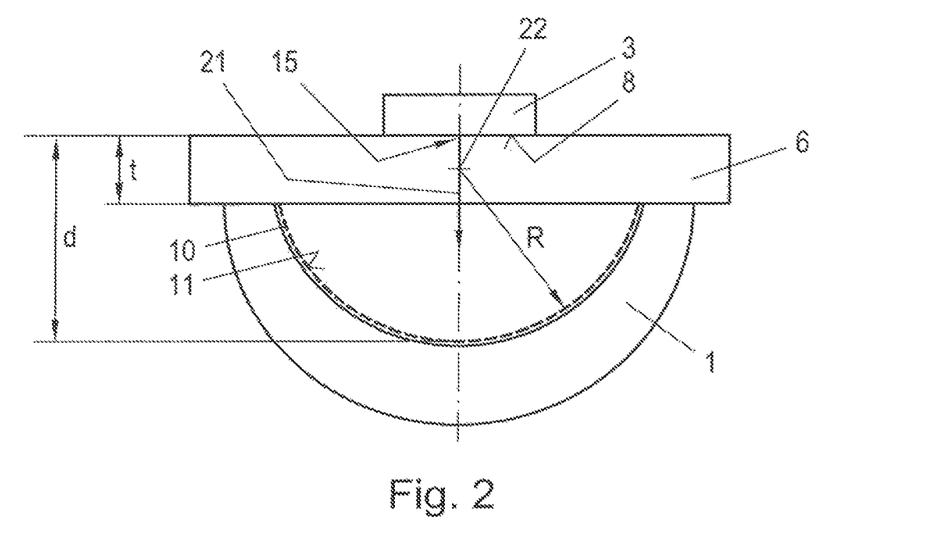
FIG. 2 shows boundary conditions in the design of the dichroic reflection surface according to FIG. 1.

FIG. 2 illustrates the design of a corresponding arrangement of lens 1, carrier plate 6 and conversion element 3. The carrier plate 6 made of sapphire is plane-parallel and has a thickness t taken perpendicular to the directions of the planar extension; its index of refraction n is approximately 1.8.

The surface focal point 15 of the pump radiation incidence surface 8 has a distance d to the reflection surface 11 taken along a surface normal 21. The curvature of the reflection surface 11 has a radius R, which corresponds to approximately 1.2 times the mean extension x of the pump radiation incidence surface 8. In the present case, the pump radiation incidence surface 8 is square and the mean extension x results as mean value of edge length and diagonal. The pump radiation incidence surface 8 has in this example a surface taken perpendicularly in relation to the optical axis 17 of 1×1 mm², x thus results as x≈1.2 mm. Radius R is 0.7 mm and d results as approximately d≈0.83 mm. The thickness of the carrier plate 6 is 0.5 mm, and it has an index of refraction n=1.78.

In the case of pump radiation 2 incident in collimated form on the pump radiation entry surface 4 of the lens 1, the radius $R_{EF}$ of the pump radiation entry surface 4 is then, for example, 1.08 mm with a distance taken along the optical axis 17 to the reflection surface 11 of 2 mm (index of refraction of the lens: 1.62). If the pump light 2 is incident in slightly focused form on the pump radiation entry surface 4, for example, the radius $R_{EF}$ can then be 1.2 mm with a distance to the reflection surface 11 of 2 mm (index of refraction of the lens: 1.62).

The center point 22 of the sphere on which the reflection surface 11 is based is firstly located with the radius R on a straight line along the surface normal 21. Furthermore, the distance d is adapted so that it corresponds to the total of radius R and t (1−1/n). An offset caused by the carrier plate 6 is thus taken into consideration such that as a result the backscatter conversion light 16 is incident perpendicularly on the reflection surface 11.

FIG. 3 shows an alternative design to the embodiment according to FIGS. 1 and 2 with respect to the reflection/transmission properties of the reflection layer 31 having the reflection surface 32. In this case, specifically full mirroring is provided, thus, not only the backscatter conversion light (not shown for the sake of comprehensibility), but rather also backscattered backscatter pump radiation 33 is reflected on the reflection surface 32.

In order that the pump radiation 2 originating from the pump radiation source can still reach the conversion element 3 through the lens 1, the pump radiation exit surface 5 is not completely covered using the reflection layer 31 in this case.

The pump radiation 2 traverses the lens 1 offset in relation to its optical axis 17 and thus passes the reflection layer 31.

The efficiency of the illumination device can be further increased in that backscatter pump radiation 33 is also reflected in the region of the reflection layer 31, in addition to the backscatter conversion light. This is because the reflection surface 32 is concavely curved similarly to the above description, so that the backscatter pump radiation 33, like the backscatter conversion light as well, is incident substantially perpendicularly on the reflection surface 32.

Both the backscatter conversion light and also the backscatter pump radiation 33 are specifically emitted in a Lambertian manner on the pump radiation incidence surface and therefore with the same angle distribution.

The backscatter pump radiation 33 is thus incident substantially perpendicularly on the reflection surface 32 and is therefore reflected back to its location of origin on the pump radiation incidence surface 8, i.e., it is again incident on the conversion element 3 and can be converted. The efficiency is thus increased not only by the use of the backscatter conversion light, but rather also by an improved use of the pump radiation.

Figure 5:
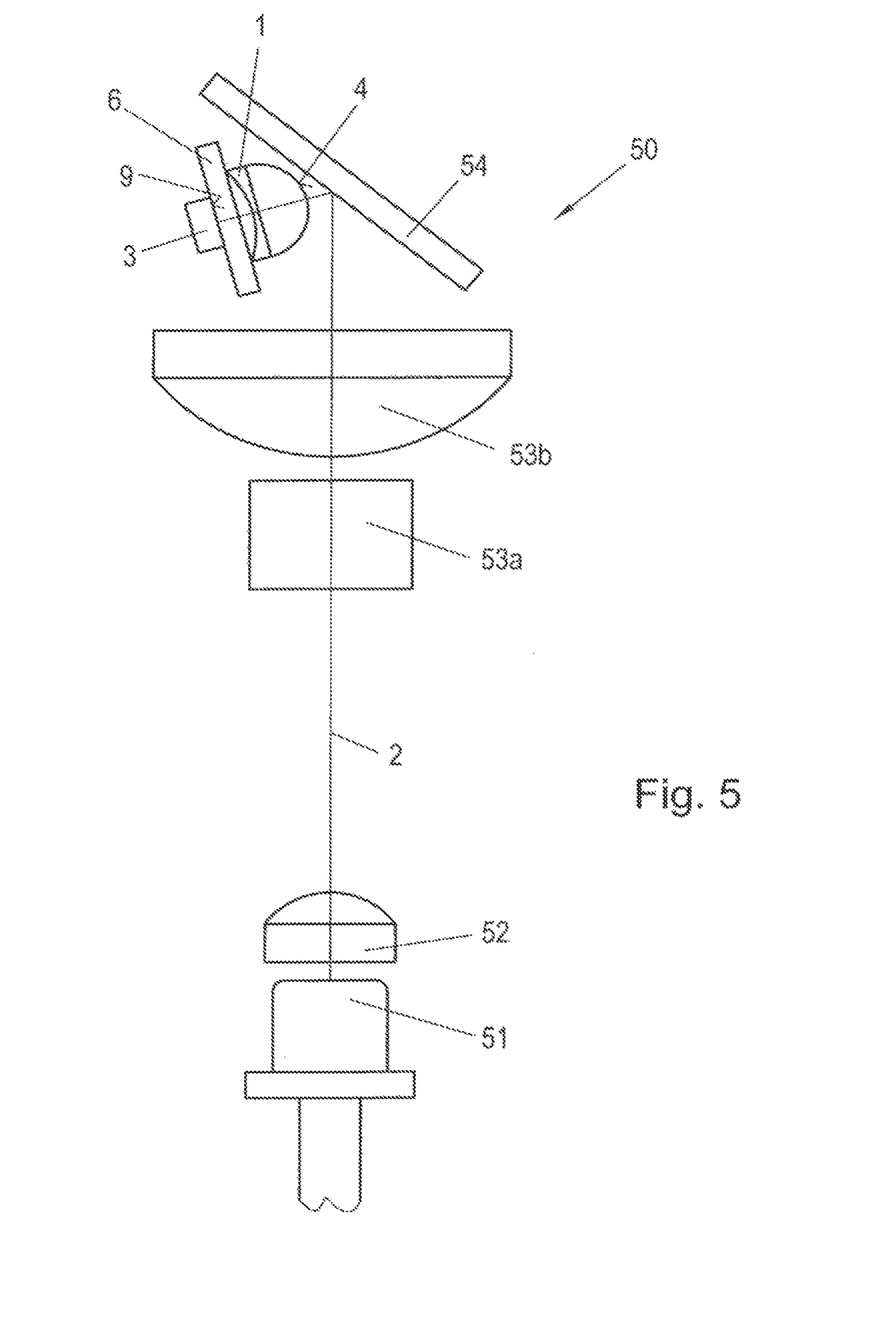
FIG. 5 shows an illumination device according to various embodiments having conversion element, lens, and pump radiation source.

FIG. 5 shows the structure of a radiation device 50 as a whole proceeding from the lens according to FIGS. 1 and 2, i.e., for the case of a dichroic reflection layer 11.

The pump radiation 2 (only one main beam is shown for the sake of comprehensibility) is emitted by a laser diode 51 and collimated by a planar-convex condenser lens 52. A superposition optical unit 53 is provided downstream thereof, which superimposes the pump radiation 2 emitted by the laser diode 51 with the pump radiation of further laser diodes. In the present case, an array of laser diode 51 is thus provided, which are arranged in a row perpendicularly in relation to the plane of the drawing. Specifically, these are three laser diodes, of which, in addition to the illustrated laser diode 51, one lies behind and the other in front of the plane of the drawing.

The superposition optical unit 53 guides together the three laser beams, specifically via reflections in wedge plates 53*a* and a downstream planar-convex lens 53*b*. The pump radiation 2 is then deflected via a mirror 54 onto the pump radiation entry surface 4 of the lens 1, traverses the lens 1 and the downstream carrier plate 6, and is finally incident on the pump radiation incidence surface 8 of the conversion element 3. Reference is made to the above description with respect to the further interaction of the lens having the dichroic reflection layer 10 (not shown in the present case) with backscatter conversion light emitted on the pump radiation incidence surface 8.

Figure 6:
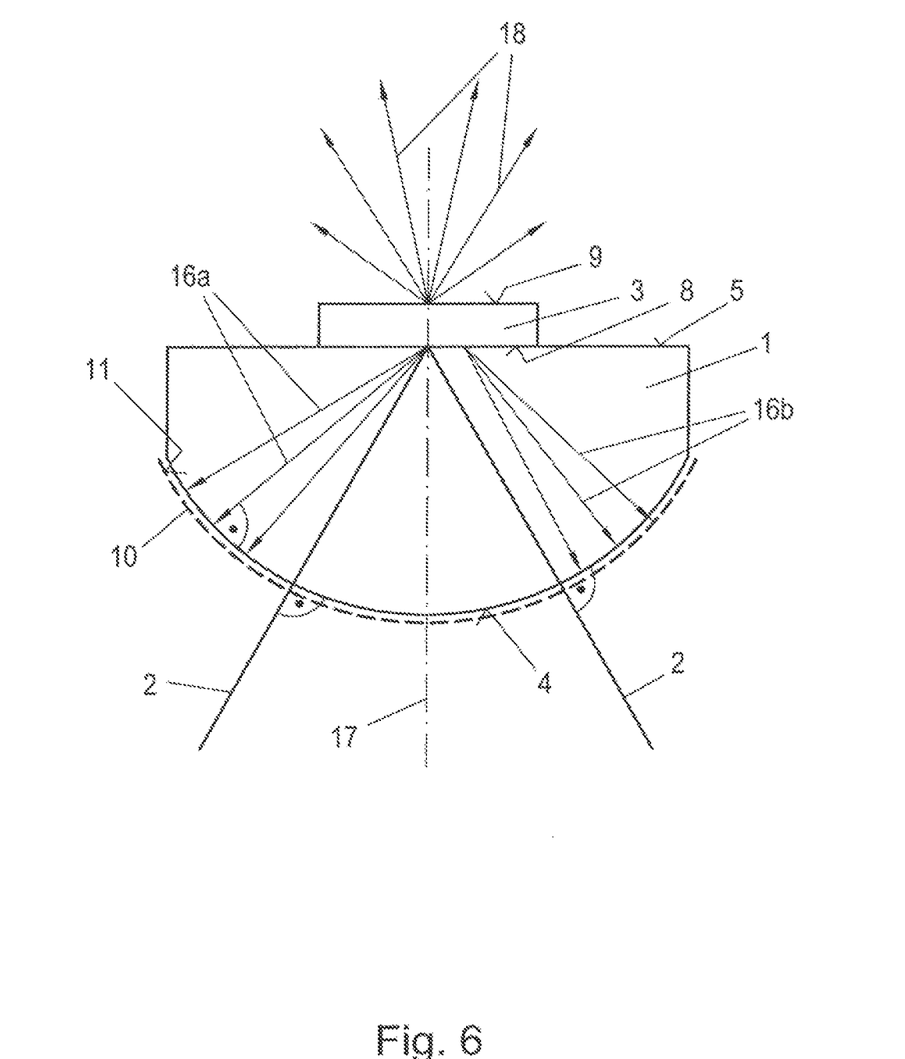
FIG. 6 shows a part of a third illumination device according to various embodiments having a dichroic reflection surface in a schematic section.

FIG. 6 shows, as a further embodiment, a part of an irradiation device, specifically a planar convex lens 1, which focuses pump radiation 2 on a conversion element 3. In this case, the pump radiation 2 is incident focused by an upstream lens (not shown) on the convex (concave with respect to the conversion element 3) pump radiation entry surface 4 of the lens 1. The pump radiation 2 is focused such that it is incident perpendicularly on the pump radiation entry surface 4.

The reflection layer 10 is provided on the convex pump radiation entry surface 4. Backscatter conversion light 16*a*, *b*, which is emitted by the conversion element 3 (again YAG:Ce) on the pump radiation incidence surface 8 (=backscatter emission surface), is again incident at small angles of incidence (substantially perpendicularly) on the reflection surface 11, which is concave in relation to the conversion element 3, and is reflected back to the conversion element 3, which increases the proportion of the conversion light 18 emitted on the conversion radiation emission surface 9.

The curved reflection layer 10 having the reflection surface 11 is provided in this case on the convex pump radiation entry surface 4. The conversion element 3 is arranged, specifically adhesively bonded, directly (in direct optical contact) on the planar pump radiation exit surface 5.

In this case, the reflection surface 11 in a conversion element 3 having a (square) surface area taken perpendicularly to the optical axis of $1 \times 1$ mm$^2$ (x≈1.2) has a radius of curvature of 2 mm with an index of refraction of the lens 1 of 1.78.

The previous exemplary embodiments according to FIGS. 1, 2, 3, 5, and 6 were each directed to a conversion element 3 operated in transmission, in which the backscatter emission surface 8 is thus equivalent to the pump radiation incidence surface 8 or, in other words, the pump radiation is supplied on one side (pump radiation incidence surface) and the conversion light is emitted on the opposite side (conversion radiation emission surface).

Figure 7:
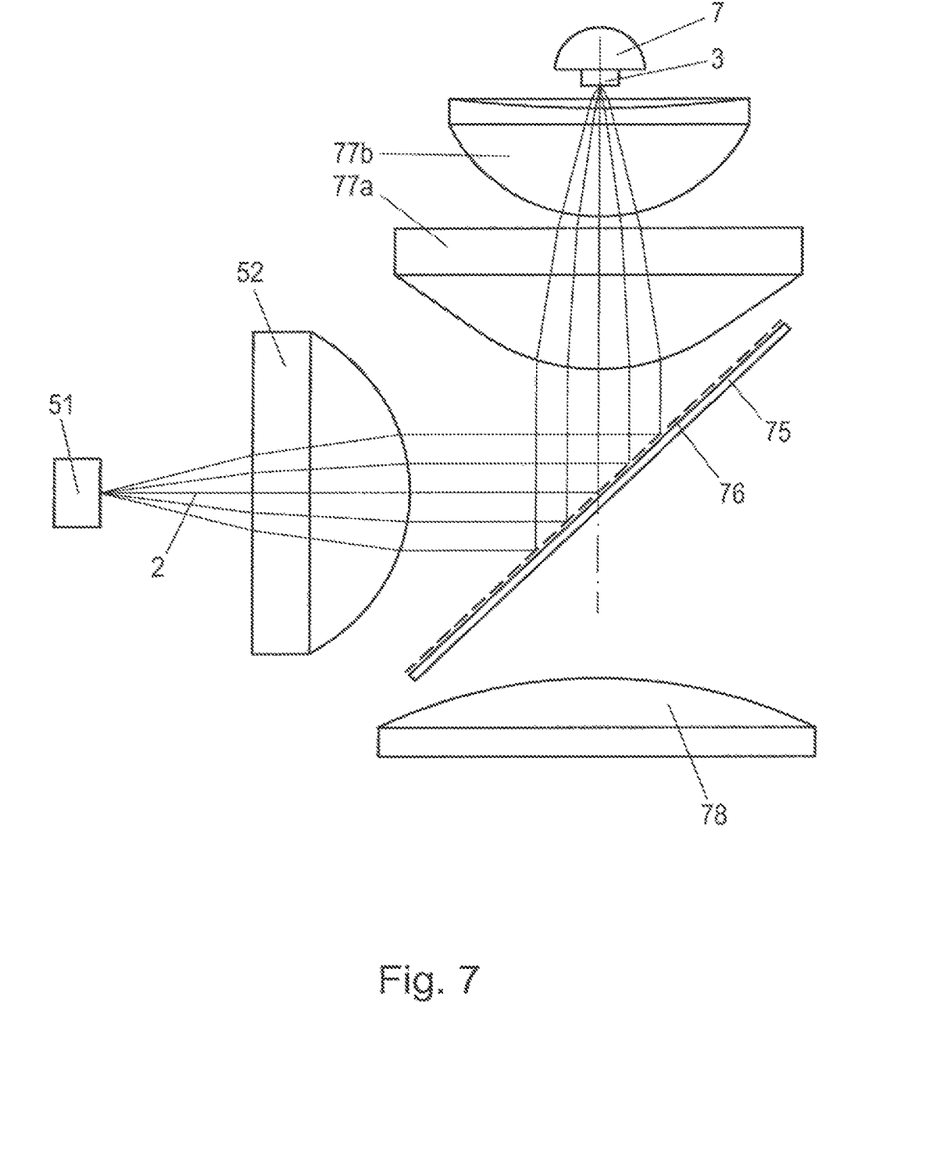
FIG. 7 shows a fourth illumination device according to various embodiments, in which the conversion element is operated in reflection, in contrast to those according to FIGS. 1 to 6.
Figure 8:
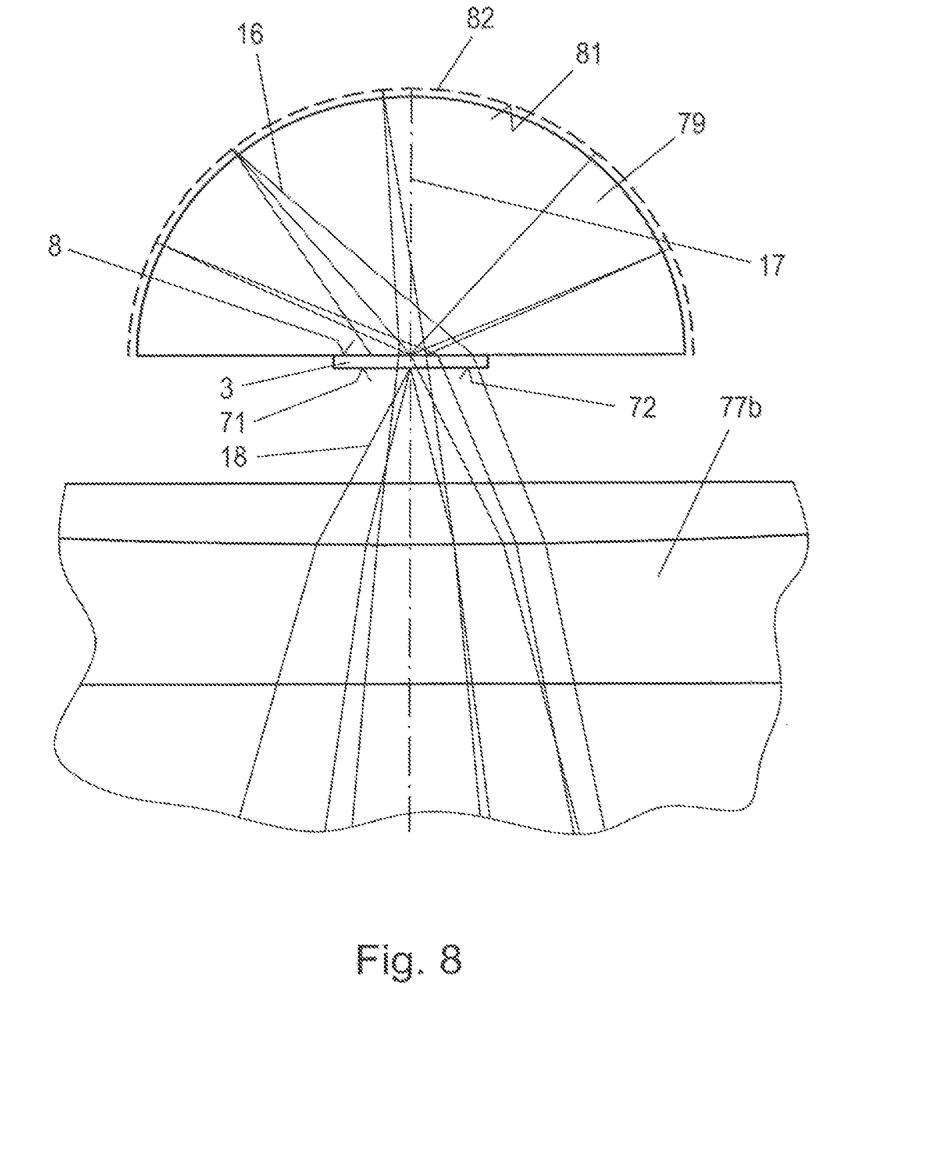
FIG. 8 shows a detail view of the illumination device according to FIG. 7.

In contrast, the conversion element in the exemplary embodiment according to FIGS. 7 and 8 is operated in reflection, i.e., pump radiation is supplied on one side and the conversion light is emitted on the same side. The pump radiation incidence surface 71 is in this case also the conversion radiation emission surface 72, and the backscatter emission surface 8 is opposite to the two surfaces 71, 72 (cf. FIG. 8 for a detail view).

FIG. 7 illustrates the structure, using which the conversion element 3 is operated in reflection, in an overview. The pump radiation 2, which again originates from a laser diode 51, is collimated using the planar convex condenser lens 52 (collimation lens). A beam splitter 75 having a dichroic reflection layer 76 is arranged downstream thereof, on which the pump radiation 2 is reflected, but which is then transmissive for the conversion light. The pump radiation 2 is focused on the pump radiation incidence surface 71 of the conversion element 3 via a lens system 77 made of a planar convex lens 77*a* and a meniscus 77*b*.

The conversion light generated as a result thereof is partially (~50%) emitted on the conversion radiation emission surface 72, the other part (~50%) is emitted as backscatter conversion radiation 16 on the backscatter emission surface 8. Reference will be made thereto in detail hereafter on the basis of FIG. 8.

The conversion light emitted on the conversion radiation emission surface 72 is substantially collimated via the lens system 77 (also used for coupling in the pump radiation), traverses the dichroic layer 76 and the beam splitter 75, and is subsequently focused by a decoupling lens 78 and supplied to the illumination application. For the sake of comprehensibility, the beam path of the conversion light is not shown in FIG. 7.

FIG. 8 shows the conversion element 3 with the planar convex lens 79, which is downstream with respect to the path of the pump radiation 2 in this case, in an enlarged illustration. In this case, the pump radiation is not shown, but rather to the conversion light, specifically using several beams taken as examples from a ray tracing simulation. In this case, both conversion light emitted originally on the conversion radiation emission surface 72 and also backscatter conversion light 16 emitted on the backscatter emission surface 8 are shown.

The conversion element 3 is adhesively bonded on the lens 7, the backscatter conversion light 16 thus enters the planar convex lens 79 (via the adhesive layer, which is negligible in principle) and is then incident on the reflection surface 81 of the reflection layer 82 (a metal film) and is reflected back to the conversion element 3. This reflected backscatter conversion light then traverses the conversion element 3 and also exits in large part on the conversion radiation emission surface 72. It can be used jointly with the conversion light 18 originally emitted there.

On the other hand, all of the pump radiation 2 is also not converted during the first passage through the conversion element 3, but rather a part thereof also exits on the backscatter emission surface 8, and does so tilted at an angle in relation to the optical axis 17 as a result of scattering processes. For the sake of comprehensibility, the pump radiation is not shown in FIG. 8, but the pump radiation emitted on the backscatter emission surface 8 is reflected back to the conversion element 3, comparably to the backscatter conversion light 16, on the curved reflection surface 81. The full mirroring is reflective both for the pump radiation and also for the conversion light.

The pump radiation reflected back to the conversion element 3 is then converted in large part (during the renewed passage through the conversion element 3), which increases the efficiency. The curved reflection surface 81 is thus advantageous both with respect to the conversion light (usage jointly with the conversion light emitted originally on the conversion radiation emission surface 72) and also the pump radiation, because it reflects the latter to the conversion element 3.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An irradiation device comprising:
   a pump radiation source for emitting pump radiation,
   a conversion element for at least partially converting the pump radiation into longer-wave conversion radiation, which conversion element has a conversion radiation emission surface,
   and a reflection surface at least partially reflective for the conversion radiation, on which a backscatter conversion radiation is incident, which the conversion element emits on a backscatter emission surface opposite to the conversion radiation emission surface, which reflection surface is concavely curved with respect to the conversion element such that at least all of the backscatter conversion radiation, which is divergently emitted in a surface focal point of the backscatter emission surface is incident at a respective angle of incidence of at most 20° in absolute value on the reflection surface,
   wherein the backscatter emission surface is equivalent to a pump radiation incident surface, and
   wherein the reflection surface is part of a lens, which is arranged between the pump radiation source and the conversion element, which lens may be provided and arranged so that it focuses the pump radiation on the conversion element.

2. The irradiation device as claimed in claim 1, wherein the reflection surface is concavely curved such that at least 80% of all of the backscatter conversion radiation is incident on the reflection surface at an angle of incidence which is less than 20° in absolute value.

3. The irradiation device as claimed in claim 1, wherein an optically active gas volume is arranged between the reflection surface and the conversion element.

4. The irradiation device as claimed in claim 1, wherein the reflection surface at least regionally has the shape of a spherical surface.

5. The irradiation device as claimed in claim 4, wherein the sphere on which the spherical surface is based has a radius R and the backscatter emission surface has a mean extension x, wherein $R \geq x/2$.

6. The irradiation device as claimed in claim 4, wherein the surface focal point of the backscatter emission surface has a distance d, which is taken along a surface normal, to the reflection surface and the sphere on which the spherical surface is based has a radius R, wherein $d \geq R$.

7. The irradiation device as claimed in claim 1 further comprising a carrier transmissive for the pump radiation and the conversion radiation, preferably a plane-parallel plate, which is arranged between the lens and the conversion element and on which at least the conversion element is fastened.

8. The irradiation device as claimed in claim 1, wherein the lens has a pump radiation entry surface and a pump radiation exit surface and the reflection surface is provided on one thereof.

9. The irradiation device as claimed in claim 8, wherein the reflection surface is provided on the pump radiation exit surface and the pump radiation entry surface is concavely curved with respect to the conversion element, specifically the lens has the shape of a positive meniscus.

10. The irradiation device as claimed in claim 1, wherein a dichroic reflection layer provides the reflection surface, which dichroic reflection layer is substantially transmissive for the pump radiation.

11. The irradiation device as claimed in claim 10, wherein the lens has a pump radiation entry surface and a pump radiation exit surface and the reflection layer completely covers one thereof.

12. The irradiation device as claimed in claim 1, wherein the reflection surface is reflective for the pump radiation and the pump radiation is guided past the reflection surface through the lens.

13. A method of light emission for an irradiation device, comprising:
   emitting pump radiation with a pump radiation source;
   at least partially converting the pump radiation into longer-wave conversion radiation with a conversion element, which conversion element has a conversion radiation emission surface, wherein conversion light emitted on the conversion radiation emission surface is used for the illumination; and
   at least partially reflecting for the conversion radiation with a reflection surface, on which a backscatter conversion radiation is incident, which the conversion element emits on a backscatter emission surface opposite to the conversion radiation emission surface, which reflection surface is concavely curved with respect to the conversion element such that at least all of the backscatter conversion radiation, which is divergently emitted in a surface focal point of the backscatter emission surface is incident at a respective angle of incidence of at most 20° in absolute value on the reflection surface,
   wherein the backscatter emission surface is equivalent to a pump radiation incident surface, and
   wherein the reflection surface is part of a lens, which is arranged between the pump radiation source and the conversion element, which lens may be provided and arranged so that it focuses the pump radiation on the conversion element.

14. An irradiation device comprising:
a pump radiation source for emitting pump radiation;
a conversion element for at least partially converting the pump radiation into longer-wave conversion radiation, which conversion element has a conversion radiation emission surface;
a reflection surface at least partially reflective for the conversion radiation, on which a backscatter conversion radiation is incident, which the conversion element emits on a backscatter emission surface opposite to the conversion radiation emission surface, which reflection surface is concavely curved with respect to the conversion element such that at least all of the backscatter conversion radiation, which is divergently emitted in a surface focal point of the backscatter emission surface is incident at a respective angle of incidence of at most 20° in absolute value on the reflection surface, wherein the reflection surface at least regionally has the shape of a spherical surface, and wherein the surface focal point of the backscatter emission surface has a distance d, which is taken along a surface normal, to the reflection surface and the sphere on which the spherical surface is based has a radius R, wherein d≥R, and wherein the reflection surface is part of a lens, which is arranged between the pump radiation source and the conversion element, which lens may be-provided and arranged so that it focuses the pump radiation on the conversion element; and
a carrier transmissive for the pump radiation and the conversion radiation, preferably a plane-parallel plate, which is arranged between the lens and the conversion element and on which at least the conversion element is fastened, wherein the carrier is a plane-parallel plate, which has a thickness t and an index of refraction n, wherein $0.7 \cdot (R + t \cdot (1-1/n)) \leq d \leq 1.3 \cdot (R + t \cdot (1-1/n))$.

* * * * *